(12) United States Patent
Jiang et al.

(10) Patent No.: US 10,353,287 B1
(45) Date of Patent: Jul. 16, 2019

(54) METHODS OF PRODUCING MULTICOLOR IMAGES IN A SINGLE LAYER OF CHOLESTERIC LIQUID CRYSTAL POLYMER

(71) Applicants: Yingqiu Jiang, Sunnyvale, CA (US); Aharon Hochbaum, Berkeley, CA (US)

(72) Inventors: Yingqiu Jiang, Sunnyvale, CA (US); Aharon Hochbaum, Berkeley, CA (US)

( * ) Notice: Subject to any disclaimer, the term of this patent is extended or adjusted under 35 U.S.C. 154(b) by 328 days.

(21) Appl. No.: 15/437,391

(22) Filed: Feb. 20, 2017

Related U.S. Application Data

(60) Provisional application No. 62/330,258, filed on May 2, 2016.

(51) Int. Cl.
| | | |
|---|---|---|
| *B42D 25/364* | (2014.01) | |
| *G03F 7/00* | (2006.01) | |
| *G02F 1/13* | (2006.01) | |
| *B05D 3/06* | (2006.01) | |
| *B05D 7/00* | (2006.01) | |
| *G03F 7/20* | (2006.01) | |
| *B42D 25/41* | (2014.01) | |

(52) U.S. Cl.
CPC .......... *G03F 7/0005* (2013.01); *B05D 3/067* (2013.01); *B05D 7/53* (2013.01); *B42D 25/364* (2014.10); *B42D 25/41* (2014.10); *G02F 1/132* (2013.01); *G03F 7/2002* (2013.01); *G03F 7/70* (2013.01)

(58) Field of Classification Search
CPC ......... G02F 1/132; B05D 3/067; B42D 25/41; B42D 25/364; B42D 2033/02; B42D 2033/12; B42D 2033/14; B42D 2033/26; G03F 7/0005; G03F 7/2002; G03F 7/40

USPC .......... 430/20, 321; 283/85, 86, 91, 114
See application file for complete search history.

(56) References Cited

U.S. PATENT DOCUMENTS

| | | |
|---|---|---|
| 4,140,016 A | 2/1979 | Fergason |
| 6,117,920 A | 9/2000 | Jolliffe et al. |
| 6,836,307 B2 | 12/2004 | Norihito |
| 9,279,084 B2 | 3/2016 | Dunn et al. |
| 2003/0104144 A1* | 6/2003 | Hammond-Smith ............... C09K 19/38 428/1.21 |

(Continued)

FOREIGN PATENT DOCUMENTS

| | | |
|---|---|---|
| WO | WO 00/34808 | 6/2000 |
| WO | WO 2008/138512 | * 11/2008 |
| WO | WO 2011/017749 | * 2/2011 |

OTHER PUBLICATIONS

Computer-generated translation of WO 2008/138512 (Nov. 2008). (Year: 2008).*

*Primary Examiner* — John A McPherson (57) ABSTRACT

The current invention relates to methods for generating images with multiple reflection colors in a single layer of cholesteric liquid crystal polymer (CLCP) for optical security applications such as optical devices and labels for brand protection or document security. The multicolor feature enhances the counterfeiting resistance of a CLCP based optical devices, in addition to its intrinsic polarized selective reflection and being an optical variable device. The fabrication methods include: digital printing on CLCP, the use of heat transfer masks and UV masks as well as hot stamping techniques. Embodiments are presented that adapt the above methods to continuous, roll-to-roll printing lines.

15 Claims, 8 Drawing Sheets

(56) References Cited

U.S. PATENT DOCUMENTS

2006/0108063 A1\* 5/2006 Umemoto ................ B41M 3/14
                                                    156/272.2
2015/0110999 A1\* 4/2015 Goetz ...................... B05D 3/06
                                                    428/156

\* cited by examiner

METHODS OF PRODUCING MULTICOLOR IMAGES IN A SINGLE LAYER OF CHOLESTERIC LIQUID CRYSTAL POLYMER

CROSS-REFERENCE TO RELATED APPLICATION

This application claims priority under 35 U.S.C. §§ 119 (e) from U.S. provisional patent application No. 62/330,258, titled "METHODS OF PRODUCING MULTIPLE COLOR IMAGES IN A SINGLE LAYER OF CHOLESTERIC LIQUID CRYSTAL POLYMER" and filed on May 2, 2016.

BACKGROUND OF THE INVENTION

Counterfeiting of consumer goods, paper currencies, financial documents and identification cards is countered by a large variety of optical security measures designed to deter and defeat this illicit activity. Optical variable devices (OVDs) that change their apparent color when viewed from different angles are particularly effective optical security devices for anti-counterfeiting and brand protection applications. Among them, cholesteric liquid crystal polymer (CLCP) films or pigments have become more prevalent in the security printing industry. CLCP laminates or pigments offer two visual security levels based on a unique color shift effect (OVD) and on a selective polarized reflection effect. Both effects can be utilized as distinctive signatures for optical authentication. Said two effects cannot be reproduced by counterfeiters employing standard reproduction techniques or using non-CLCP materials. A third, forensic, security level is based on the CLCP unique and tunable reflection spectrum.

Users of optical security devices prefer labels with additional functionalities. In particular, labels having printed information or identifying patterns (e.g. barcodes or logos) that can be easily read or identified by consumers, are preferred over blank colored CLCP labels that are currently in use. Therefore, CLCP labels that can be fabricated by conventional printing techniques to provide informative, multicolor information, in addition to OVD and polarized reflection effects, are very useful.

While CLCP films or pigments are inherently colored, they are usually applied as monochrome images. Formulating CLC monomer materials into inks of different colors and using standard printing techniques to create multicolor images is difficult and expensive since these materials are usually solids at ambient temperature and are soluble only in non-aqueous solvents. Attempting to create multicolor CLCP images requires typically multiple printing runs of each color, multiple masks and precise mask registration. There is, therefore, a need for a practical and economical solution which can provide multicolor images based on CLCP materials.

It is desirable to achieve a multicolor CLCP images using conventional roll-to-roll printing equipment for high throughput and mass production of low cost security labels. The images of CLCP labels can consist of a fixed repetitive images, or they can be serialized images, where the image or information therein varies from one label to the next. The ability to serialize the label information is an important useful additional functionality.

It is well known that many cholesteryl derivatives organic compounds, that have a cholesteric liquid crystal (CLC) phase, exhibit a thermochromic effect whereby their reflection band, or color, shifts with temperature. An early report of such effect was published by Fergason et al. Increasing the temperature of most of these materials cause a shift of their reflection color to shorter wavelength ("blue-shift"). U.S. Pat. No. 4,140,016 lists many such material formulations used in the current ubiquitous colorful temperature indicators. The thermochromic effect is highly non-linear, where most of the color change takes place near the phase transition temperature from a smectic phase at lower temperatures to a CLC phase. The nonlinear feature makes it difficult to generate a uniform and predetermined color in the presence of small temperature variations.

The above mentioned thermochromic effect was extended also to CLCP materials. U.S. Pat. No. 6,117,920 discloses a method of creating a multicolor image in a single CLCP layer using the thermochromic effect. In a multi-mask, batch process, the un-polymerized CLC layer is heated to a temperature corresponding to a first color. The CLC layer is then exposed to polymerizing UV radiation through a mask that permits exposure only of the image parts designated with the first color. The process is repeated as many times as the number of distinct colors in the image. This process is clearly slow, expensive and of low yield since the highly nonlinear thermochromic effect requires exquisite temperature uniformity to generate a required color and control the uniformity of that color throughout the CLC layer. In a second implementation, a single grayscale mask is used where each grayscale level corresponds to a different color. The CLC layer is heated to a temperature corresponding to a first color and then is exposed to a precise UV dose that is sufficient for polymerizing only the parts of the image that correspond to the most transparent grayscale level. This process is repeated, at different temperature for each color, with higher UV doses for each subsequent color. The second implementation reduces the number of required masks at the cost of requiring collimated UV light source and a precise control of the exposure, thus leading to a slow, expensive and a low yield process. In addition, it is difficult to achieve with any of the above implementations a material system that provides a full color gamut from the red to green to blue.

Publication WO 00/34808 describes a method of generating multiple colors by applying UV radiation, at a constant temperature, to modify the cholesteric pitch in selected areas and hence also their colors. The change in color results from the reduced chirality of at least one of the chiral dopants, in the CLC mixture, after being irradiated. The chiral component is either been irreversibly broken into non-chiral products or is been reversibly transformed into an isomer of a lesser chirality. Only after forming a complete colored image, a different wavelength UV radiation is applied to polymerize the entire, now patterned, CLC layer and freeze the image. Color patterning is obtained by using a grayscale UV mask. In order to keep the cholesteric pitch and color constant across the CLC layer, the UV absorption of the image forming UV radiation must be very low, leading to a poor utilization of the UV energy. This method puts sever requirements on the materials used to assure that the pitch modification step does not cause polymerization. This can be done by forming the image either at low temperature where polymerization is inhibited or with a UV wavelength that has negligible polymerization effect or in an oxygen rich atmosphere that inhibits polymerization. These requirements are difficult and expensive to implement on a roll-to-roll production line and, in the end, not entirely effective. An additional problem is that the above process disturbs the quality of the planar cholesteric configuration leading to a lower color purity either due to a reflection band broadening or due to excessive light scattering from disclination lines in the converted cholesteric. The latter problem has been alleviated by annealing the CLC at a temperature below its phase transition before polymerization as disclosed in U.S. Pat. No. 6,836,307. However, it remains a slow process that requires very intense UV irradiation and is expensive to implement.

A similar approach to generating multicolor in a single CLCP layer is disclosed in U.S. Pat. No. 9,279,084. A trigger dopant molecule is used to change selectively the CLC pitch, and hence its color, by exposing it to a first wavelength of non-polymerizing UVA radiation. When the writing of a multicolor image is completed, an exposure to a second wavelength of polymerizing UVB radiation freezes the image. The trigger molecule is chiral molecule capable of inducing a twist in a non-chiral LC and thus inducing a CLC structure. When added to an already CLC phase of some color, depending on its sense of chirality, the trigger dopant can either further tighten the cholesteric twist or partially unwind it, thus shifting the base reflection color to the blue or to the red. Its ability to act so is quantified by an intrinsic property called 'twisting power'. The unique feature of the trigger molecules disclosed in U.S. Pat. No. 9,279,084 is that they have two conformations (isomers) of different twisting powers, one value of twisting power in its ground state and a different one in its excited state. A transition between the two conformations in one direction is induced by exposure to UVA radiation. The opposite transition happens spontaneously with a decay time that is sensitive to temperature. The effective twisting power of the trigger dopant depends on the numbers of the trigger molecule populations in each of the two conformations. These numbers depend on the intensity of the UVA pulse and is clearly a dynamic quantity. The trigger molecule approach requires very high UV intensities and fast image formation to minimize the effect of relaxation of the excited state conformation and to limit the effect of molecular diffusion that can cause a drift of the colors from their intended values or blurred the border lines between two differently colored areas. In addition, this method has necessarily poor utilization of the UVA radiation. The absorption of the first wavelength by the CLC layer must be low to assure a uniform UVA intensity throughout the layer thickness. Otherwise, a non-uniform UVA intensity will induce a gradient in the pitch of the cholesteric layer that will lead to a broad reflection band of poor color purity and of low reflectivity. While U.S. Pat. No. 9,279,084 discloses also a process of generating multicolor images using conventional masks and UV sources, the dynamic nature of this method and the necessarily poor UVA absorption make it practical only if a high intensity UV laser and a laser scanning methods are used to write images. This approach of generating multicolor images requires expensive specialty chemicals such as the trigger dopant, narrow-band photoinitiators in the UVB and puts sever requirements on all reactive components to inhibit polymerization under the high intensity addressing UVA radiation. Capital investment and maintenance cost of such a complicated production system are high since the image forming step is non-standard for roll-to roll production lines.

The current invention solves the problems in the prior art. The invention disclosed herein teaches a set of novel techniques for manufacturing of CLCP based labels where the visible information is printed in multiple colors on an opaque or transparent substrates. Multicolor images are created from a single, monochrome uniform pitch CLCP layer; and yet no special liquid crystal materials or dopants or special UV light source are required. The invention disclosed herein is particularly adaptable to continuous web, roll-to-roll, printing lines. As a result, the current invention makes possible high throughput production line, high quality images and a low cost of the final CLCP label.

SUMMARY OF THE INVENTION

The current invention discloses few process embodiments for creating multicolor images in a CLCP layer using conventional printing methods.

One aspect of the present invention is to provide practical methods for generating multicolored images in a single CLCP layer that are compatible with batch production processes as well as with roll-to-roll printing lines. This feature permits low cost and high throughput production of labels, laminates or any other optical security devices containing said images without compromising the images' quality.

Additional important aspect of the current invention is to provide methods of fabricating custom and serialized images that are distinct one from another.

Yet another important aspect of the present invention is providing methods of generating halftone images that permit control of the effective image brightness.

The above-mentioned aspects, in addition to the CLCP intrinsic property of color shift (OVD device) and its unique polarized reflection, permit the production of highly counterfeit resistant labels and optical devices, having additional useful functionalities, on standard printing lines, resulting low cost products.

The basis for the production methods of multicolored images in single CLCP layers, is the novel principle, backed by many experimental results, that a partially polymerized CLCP material system can be handled like a solid polymer layer and yet remains responsive to external stimuli such as pressure and temperature. In many cases, the simultaneous application of high temperature and pressure, through appropriate masks, lead to a change of color in the corresponding areas. A useful elevated temperature range is typically 100° C.-200° C. The required pressure is in the range of commercial printers (e.g. laser printers) and laminators.

In a first embodiment, a partially cured CLCP layer is subject directly to a patterned elevated temperature and pressure, generated by commercially available digital printing equipment such as thermal transfer printers or laser printers, to form a multicolor image. These methods of fabrication are particularly useful for batch production runs.

In a second embodiment, a heat-transfer mask is first printed on a separate substrate using good heat-conductive particulate materials that protrude slightly above a relatively poor heat-conducting substrate. Different parts in the mask's image are digitally printed with distinct particulate materials that have different heat conduction properties. The mask is laminated temporarily, under elevated temperature and pressure, to a partially cured CLCP layer to develop a multicolor image. One advantage of the second embodiment is that it can be adapted in roll-to-roll, high throughput, printing lines. A second advantage of using this method is the ability to generate serial images.

A third embodiment is a variant of the second, where the heat-transfer mask is wound around a heated roller that is pressed momentarily against the CLCP layer to develop a multicolor image. This embodiment is the simplest implementation of heat-transfer mask.

In a forth embodiment, the heat-transfer mask is in a form of a closed loop belt that moves at the same speed as the CLCP web. This method provides for the use of multiple heated laminating rollers as needed to transfer the image into the CLCP.

In a fifth embodiment, the heat-transfer mask comprises transparent heat-conductive materials printed directly on the CLCP surface.

In a sixth embodiment, a UV blocking mask is used to create a latent image in the CLCP where different parts of the image are partially cured to different degrees. When such CLCP layer is subject simultaneously to uniform heat and pressure, said different parts of the image develop distinct colors.

In a seventh embodiment, the format of the UV photomask is adapted to continuous roll-to-roll production lines. The UV mask is in a form of a closed-loop belt or in a roll of film format.

In an eighth embodiment, the UV mask is stationary and is in close proximity to a moving CLCP web. A high intensity UV light source provides intense short pulses during which the web moves a distance that is much less than the image size.

In a ninth embodiment, a scanning UV laser is used to partial polymerize a CLC layer in selective areas, optionally with assistance from another UV source which partially polymerizes the entire CLC layer.

In another class of embodiments, the image on the mask comprises protruding features. In a tenth embodiment, an engraved mask is uniformly heated and is brought under pressure into contact with a partially polymerized CLCP layer, causing the color in the contact areas to be modified. A planar engraved mask is suitable for a batch production process for fabricating two-color images.

In an eleventh embodiment, the mask is in a form of a cylinder having an engraved surface. The engraved surface can also be on a separate plate that is wound around a smooth cylinder. The engraved cylindrical mask format is adaptable to a continuous roll-to-roll process for fabricating two-color images in a partially polymerized CLCP layer.

In a twelfth embodiment, pressure, with optional heating, is applied to a partially polymerized CLCP layer using a pen-like stylus to produce personalized images such as hand writing or signatures.

BRIEF DESCRIPTION OF THE DRAWINGS

FIG. 1 illustrates schematically the basic structure of a two-color CLCP label.

FIG. 3 illustrates in cross-sectional views the process steps based on a heat-transfer mask, shown in FIG. 3A, to create a two-color image in a partially polymerized CLCP layer, as depicted in FIG. 3D.

FIG. 4 illustrates a cross-sectional view of a continuous roll-to-roll configuration where a heat-transfer mask is wound around a heated roller in a laminator (shown in FIG. 4A) to generate a two-color image in a partially polymerized CLCP layer (shown in FIG. 4B).

FIG. 5 illustrates cross-sectional views of a continuous roll-to-roll configurations using a heat-transfer mask in a form of a belt (as shown in FIG. 5A) or in roll of film format (as shown in FIG. 5B) to print an image on a partially polymerized CLCP medium using one or more heated laminators. In addition.

FIG. 6 illustrates the process steps of using a UV photomask to create a multicolor image in a partially polymerized CLCP medium.

FIG. 7 illustrates cross-sectional views of a continuous roll-to-roll process using a UV photomask in a belt form (as shown in FIG. 7A) or in a roll of film form (as shown in FIG. 7B) to create a multicolor image in a CLCP web.

FIG. 9 illustrates schematically the steps of a hot-stamping process in fabricating a two-color image in a partially polymerized CLCP layer.

DETAILED DESCRIPTION OF PREFERRED EMBODIMENTS

Cholesteric liquid crystals (CLC) is a LC phase where the usually elongated shape molecules are, on the average, parallel one to the other except for a small, consistent twist around a unique axis that is perpendicular to the molecular long axis. The twisting of the molecular orientation is a result of molecular chirality, where a molecule structure cannot be superimposed on its mirror image. The axis of rotation is the optical axis of the system. The fixed rate rotation builds up to a 1D periodic structure along the optical axis. The distance required for a 360-degree rotation, the pitch (P), is the structure's period. In practice, CLC liquids are a mixture of a nematic LC component, which lacks any twist, with a chiral dopant and, therefore, it is known also as a "chiral nematic". One practical advantage of a chiral nematic mixture is that the pitch can be modified continuously by adjusting the concentration of the chiral component.

While the periodic twisted structure of a uniform pitch is the lowest energy configuration of a liquid CLC layer, the pitch length can be easily modified or even be completely unwound into the nematic phase (a state of infinitely long pitch) by electric or magnetic fields or by material flow. Unless planar surface conditions are provided, a CLC layer is likely to adopt a metastable, multi-domain structure, where each domain has the same twisting structure and pitch value, but each orients its optical axis in a random direction. The multi-domain state, known as "focal conics" texture, is associated with a strong light scattering. However, if the CLC layer has one or two confining substrates that are treated to force adjacent molecules to align along a single direction in the substrates' plane, the CLC will adopt a uniform planar configuration where its optical axis is perpendicular everywhere to the substrates. In few cases, as required by the current invention, it is possible to achieve a planar CLC configuration on a single aligning substrate, where its second surface interfaces air. Only the planar configuration is of interest herein. CLC and their polymeric analogue, CLCP, have identical structures and, hence, also exhibit identical optical properties.

The main manifestation of the periodic chiral structure in a planar configuration, is the appearance of a narrow reflection band of circularly polarized light, of the same handedness as the cholesteric structure. Typical reflection bands in the visible range are 30-60 nm wide. The center wavelength of the reflection band, $\lambda_0$, is related to the pitch by: $\lambda_0=nP$, where n is the average index-of-refraction of the CLCP. A right handed (RH) CLCP, for example, reflects completely the RH circular polarization component of unpolarized radiation within the reflection band. It completely transmits the LH polarization component within the reflection band. As a result, CLCP layers, particularly on a black background, exhibit bright reflection colors. The bright circularly polarized reflection can be extinguished when viewed through a circular polarizer of the opposite handedness. Outside the reflection band, the planar CLCP is essentially transparent.

The intrinsic reflection color of a planar CLCP layer, customarily characterized by $\lambda_0$, is the color seen for light incidence normal to the CLCP plane (along the optical axis). For light incidence at an angle $\theta$ to the optical axis, the reflected color $\lambda$ is shorter than the intrinsic color $\lambda_0$, and is given approximately by: $\lambda=\lambda_0 \cos(\theta)$. This effect is known as the "blue shift" or "color shift" of the CLCP color. The blue-shift effect is very important in optical security applications since it cannot be replicated by any known counterfeiting method. At the same time, it is readily observable and verifiable by the naked eye. Other 1D periodic structures (e.g., periodic thin film structures) also possess this useful feature and are known collectively as Optical Variable Devices (OVD).

The CLCP circularly polarized reflection is unique among OVD devices. It is useful for optical security applications as it can be verified easily with the aid of a circular polarizer, having an opposite circular sense to the CLCP, and thus can also be used to validate the authenticity of the CLCP optical device. A CLCP layer has also a forensic security level where the details of its reflection band can be verified using a spectrometer.

Since the reflection from a CLCP planar layer is specular, the blue-shift effect is observed only in specular configurations where the light source, the detector and the optical axis at the incidence point, are in the same plane and the incidence angle is equal the reflection angle. In practice, there is almost always a dominant light source, usually the closest source to the CLCP, which determines the observed CLCP reflection color. An observer can always create the specular configuration, by adjusting the tilt of the CLCP plane with respect to the eye and the dominant light source. For non-specular observational configurations, the CLCP appears essentially transparent. The latter feature is particularly useful as it allows overlaying the CLCP layer on top of a standard label without obscuring its information in most observational configurations. The CLCP's information is visible, and dominant, only in specular configurations.

In order to generate multicolor images in a CLCP layer, the above optical properties seem to require printing, in registration, of multiple CLCP mixtures of distinct colors. One novel aspect of the present invention is to demonstrate that a single CLC layer of a uniform initial pitch and reflection color is sufficient to generate a multicolor image. By post-processing of selective areas in said layer it is possible to render them with different colors, usually of shorter wavelengths.

CLC polymers (CLCP) possess all of the optical properties of liquid CLCs. The CLCP starts as a liquid mixture of LC monomers that align on a substrate and form a planar configuration. The CLCP's constituent molecules contain reactive acrylic or acrylate end groups that form a polymeric chain in response to exposure to actinic radiation. The polymerization process preserves the molecular orientation of the liquid CLC phase. As a result, the effect of the polymerization is to freeze the molecular orientation and produce a solid layer of the same optical properties as the preceding liquid CLC phase.

In the following discussion, the term "image" will mean: parts of a label or an optical device that carry useful information. For example, the image can be a green text or a logo on a red background. The complementary area to the image (the red area) is the "background". It will be assumed throughout the following discussion that there is no difference between the "image" or the "background" as far as the process is concerned as each one of them can be made to have the other's color using an identical process.

A typical fabrication process of a multicolor device consists of the following general steps:
 1. CLC mixture preparation
 2. Coating of CLC mixture on a substrate
 3. Solvent evaporation and then annealing of the CLC into its planar configuration
 4. Partial-polymerization of the entire CLC layer to form a CLCP
 5. Image addressing—addressing selected areas in the CLCP layer that are designated for a color change
 6. Image conversion—conversion of a latent image or external image (in a mask) into a multicolor image in the CLCP layer
 7. Complete polymerization of the CLCP layer and freezing-in the image and colors.
 8. Top coating at the CLCP—air interface.

Steps 1-3 and 7-8 are common to all embodiments disclosed herein. Step 4 is also executed in all embodiments except few variants where it is absent as a separate step and instead it is performed together with step 5. Steps 5 and 6 are distinct in few embodiments but both are accomplished as a single step in other embodiments.

The first process step is to prepare a mixture of reactive molecules that constitutes a liquid CLC phase. A typical CLC comprise of one or more reactive nematic and chiral components. The intrinsic reflection color of the CLC is determined by the concentration of the chiral component. A variety of low concentration additives such as surfactants, leveling agents and photoinitiators may also be added to a typical mixture. The CLC mixture is dissolved in a solvent and is flood-coated on a substrate (step 2). Solvent-coating can be accomplished by any one of standard techniques such as: slot-die, wire rod, gravure or flexo-printing. The coated layer is heated (step 3) to anneal the CLC into a uniform planar configuration throughout the layer that has a distinct reflection color. The CLC is then partially polymerized (step 4) with a predetermined UV dose. From this point on in the process, the layer will be characterized as being a CLCP, rather than CLC, even though a significant fraction of the molecules may not yet be polymerized.

The CLCP can be coated on paper or on plastic such as PET (polyester). The substrate may be opaque (e.g. paper or colored plastics) or transparent (e.g. PET or polyimide films). When a CLCP is coated on transparent substrate, the perceived specularly reflected color corresponds to the color of its reflection band. When it is coated on an opaque reflective substrate, the perceived color is a combination of the color reflected from the substrate and the color reflected from the CLCP, which depends on the viewing angle. A black background is particularly advantageous in many applications since in this case the narrowband CLCP reflection dominates and the reflected color is perceived to be saturated and vivid. In addition, the perceived contrast between the image and its background is higher on a black background. At non-specular viewing angles, the CLCP layer is essentially transparent and any underling printed information can be seen through it.

The term "fully-cured" or its equivalent "fully polymerized" will mean herein that the CLCP is polymerized, usually by UV radiation, with a large UV dose such that it becomes effectively a solid and its physical and optical properties do not change significantly by further curing. It is well known that even a fully-cured CLCP contains a significant portion of monomers that are not fully polymerized but are, nevertheless, immobilized by the surrounding solid polymer network and, therefore, are unlikely to be polymerized by any further UV exposure. By "partial curing" or "partial polymerization" it is meant herein that the CLCP is not fully-cured. Though a partially-cured CLCP may be solid enough to allow handling and processing, it was observed that few of its physical features, optical properties in particular, could still be modified in subsequent process steps. If heat or pressure are applied to a partially-cured CLCP, its optical properties can be modified. In most cases it is observed that elevated temperature and pressure cause a blue-shift from the initial reflection color, indicating that the cholesteric pitch becomes shorter. If further curing is applied at this stage, in particular if high intensity UV curing is applied, the CLCP layer transitions quickly into a fully-cured state, effectively freezing-in the shorter wavelength reflection color.

The term "partially-cured" covers a wide range of states with different degrees of polymerization depending, for example, on the UV dose to which the CLC is exposed or on the oxygen concentration during curing. Smaller shifts of the reflective color are obtained when elevated temperature and pressure are applied to a CLCP layer that is partially-cured with a higher UV dose. In the limit where the UV dose is very high, a fully-cured state is achieved and no shift in the reflective color is observed when elevated temperature and pressure are applied.

The terms "patterned heating" or "patterned pressure" are used herein to mean that heat or pressure are applied selectively to some areas of the CLCP layer and not at all, or to a much lesser extent, to others. Patterning of heat or pressure can be accomplished by applying them through appropriate masks. Simultaneous heating and pressure can be applied using the same mask.

The current invention teaches that the application of patterned heating, or patterned pressure, or simultaneously both, to a partially-cured CLCP layer, of any original reflective color, can modify the original color to a new color and thereby create a visible colored mark which is distinct from the background color. In typical CLCP materials and typical processes the new color will be of a shorter wavelength than the original color. For example, the following color combinations can be achieved (viewed at normal incidence): green on a red background, blue on green; red on Clear (where the Clear corresponds to a CLCP with a reflection band in the near-IR) and Clear on blue (where this Clear corresponds to a CLCP with a reflection band in the UVA).

Figure 1A:
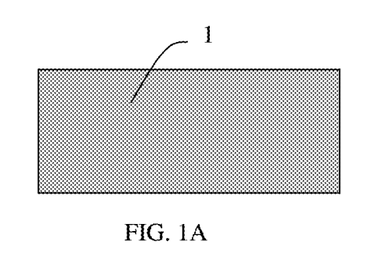
FIG. 1A and FIG. 1C are a top-view and a cross-sectional view of a partially polymerized CLCP blank layer, respectively.
Figure 1B:
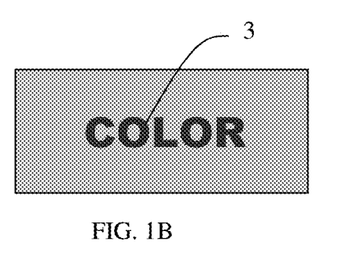
FIG. 1B and FIG. 1D are a top-view and a cross-sectional view, respectively, of said CLCP having a colored image distinct from the background color after being processed according to the current invention.
Figure 1C:
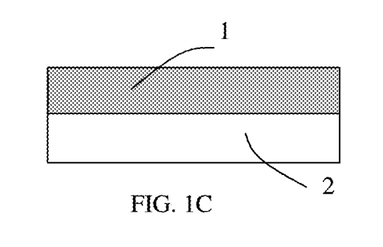
Figure 1D:
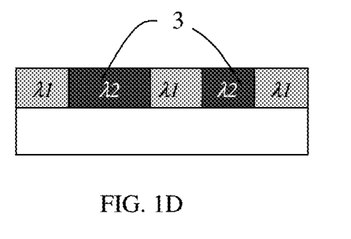

FIGS. 1A and 1C illustrate the basic configuration of a partially polymerized blank CLCP layer 1 coated on a substrate 2, in a top and cross-sectional views, respectively. FIGS. 1B and 1D illustrate the top and cross-sectional views, respectively, of the same CLCP layer on a substrate after a text-image 3, with a different color than the background, is generated. The color shift induced by the process can be, for example, from a red background $\lambda_1$ to a green image $\lambda_2$. In another example, a shift in the reflection color can be from the near-IR, which appears transparent to the human eye, to the blue. The amount of color shift can be modulated by controlling the process parameters.

A particularly useful multicolor image is that of a continuous change of colors (a "rainbow" effect). A rainbow image can be achieved by producing a spatial variation in the extent of partial-curing across a CLCP sample and converting this latent image into a visible color variation by applying elevated temperature and pressure.

In the first embodiment, illustrated in FIG. 2, a two-color label is obtained by applying "direct imaging" methods to a layer of partially polymerized CLCP. FIG. 2A depicts a cross-sectional view of a partially polymerized CLCP layer 1 on a substrate 2 having a printed pattern 4 on its top surface. The printed pattern can be generated by standard digital printing techniques such as thermal transfer printing or laser printing. FIG. 2B shows a hot lamination step applied to a partially cured CLCP, using at least one heated roller 5, under pressure during the digital printing process. As a result, the reflection from CLCP areas directly under the printed material 4, an opaque or transparent material as in FIG. 2C, is shifted to a shorter wavelength $\lambda_2$, generating a visible mark against the original background color $\lambda_1$ as depicted by the text image in FIG. 2D.

Figure 2A:
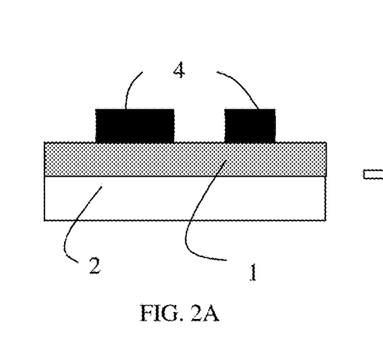
FIG. 2A illustrates a cross-sectional view the printing medium deposited on said CLCP.
Figure 2B:
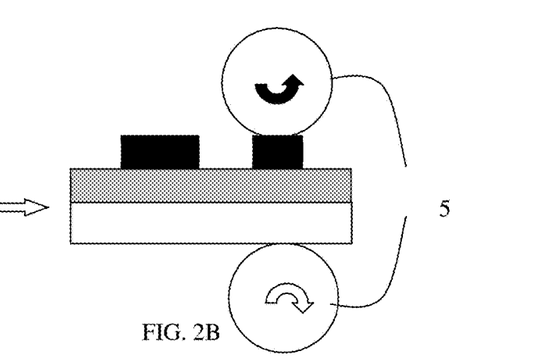
FIG. 2B is a cross-sectional view of said CLCP with said printing medium passing through a heated laminator.
Figure 2C:
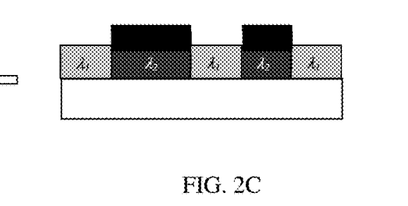
FIG. 2C illustrates a cross-sectional view of the color change in said CLCP in areas under the printed medium.
Figure 2D:
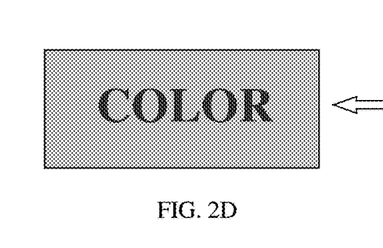
FIG. 2 illustrates schematically the process steps of making a two-color CLCP label (a top view as shown in FIG. 2D) by printing directly on a partially polymerized CLCP using a digital thermal transfer printer or a laser printer.
Figure 3A:
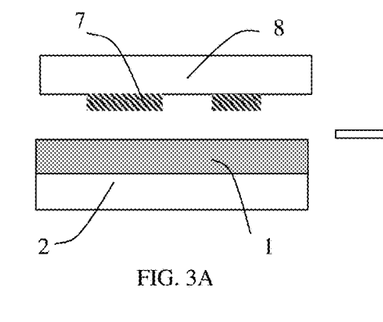
Figure 3B:
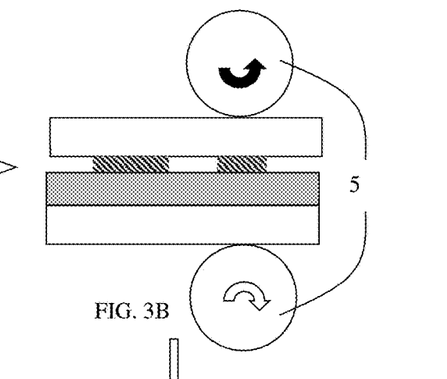
FIG. 3B shows the action of a heated laminator followed by the removal of the mask as illustrated in FIG. 3C.
Figure 3C:
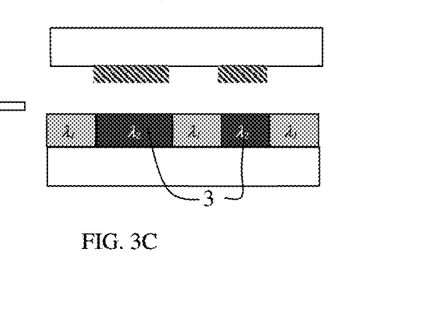
Figure 3D:
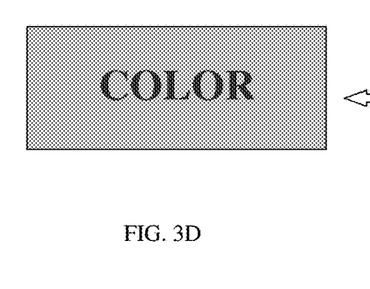

In a thermal transfer printer, a wax (or resin) coated ribbon is brought into contact with a partially polymerized CLCP layer. The thermal digital head deposits printing medium onto the CLCP. Due to localized patterned heat and pressure, the helical pitch, of the CLCP in areas in contact with the printing medium, becomes shorter. Multicolor images can be achieved by using half-tone techniques in digital printing processes. A similar color shifting process occurs when a partially polymerized CLCP is fed through a laser printer: a photosensitive drum comprising an image of toner particles 4 is brought into contact with a partially polymerized CLCP layer 1. The fuser and a laminator 5 imprint the toner image 4 onto the said CLCP thus causing a color shift in the CLCP (as shown in FIG. 2C).

Wax, resin, or toner materials are usually opaque and, therefore, images created by them on a CLCP layer require a solid black overcoat layer to hide residual opaque materials left on the CLCP. As a result, the multicolor images have to be viewed through the substrate. If the substrate is birefringent, the CLCP will exhibit a color shift effect but will lose its distinctive circularly polarized reflection feature. The latter effect can be recovered by using low birefringence substrates such as TAC or Polyimide. In a further refinement of this embodiment, a transparent toner or wax is used, rather than black or otherwise opaque materials. Using transparent printing media permits viewing of the image through the top surface, thus allowing for the use of cheap birefringent substrate films such as PET. In this case, the multicolor CLCP image retains both the OVD and the circularly polarized reflection effects. An optically clear overcoat layer, which is usually applied on the CLCP for protection, can hide the residual clear wax, resin or toner materials that stick to the CLCP by optical index matching.

In a second embodiment, as depicted in FIG. 3, an image made of a good heat-conducting material 7, which is be printed on a separate substrate 8, is used as a heat-transfer mask. The substrate 8 is typically a poor heat-conductor compared with the printed material that protrude few micrometers above the substrate. The heat-transfer image may comprise carbon black particles or metallic particles or toner particles or silicon rubber particles or particulate inks having good heat conductivity. In addition, many polymeric materials can also be used as their thermal-conductivity need only be better than that of the substrate. The patterned transfer material 7 and its substrate 8 constitute a heat-transfer mask. The mask is laminated by a pair of rollers 5, as shown in FIG. 3B, to a partially polymerized CLCP layer 1, on a substrate 2, under sufficient pressure, while using at least one uniformly heated roller 5, to generate a multicolor image (FIG. 3C—a side view and FIG. 3D—a top view) in the CLCP. In some cases, the pressure exerted by a lamination process at room temperature may be sufficient to generate a color contrast. Multiple colors can be achieved using this method by printing heat-transfer masks having particles of different heat conductivities at different parts of the image or different densities of particles. As a result, the heat-transfer image in the mask is converted into a multicolor image in the CLCP layer where the image regions reflect shorter wavelengths than the background area.

Heat-transfer masks can be printed in a separate operation on a paper or a polymer substrate using digital thermal transfer printer or a laser printer or by other standard printing technologies such as flexo, gravure, or screen printing. In one implementation the heat-transfer medium is transparent. In this case, even if some of the mask material sticks to the CLCP during lamination at elevated temperature and pressure, the visual impact is small, particularly after being index matched by a top-coating layer.

Figure 4A:
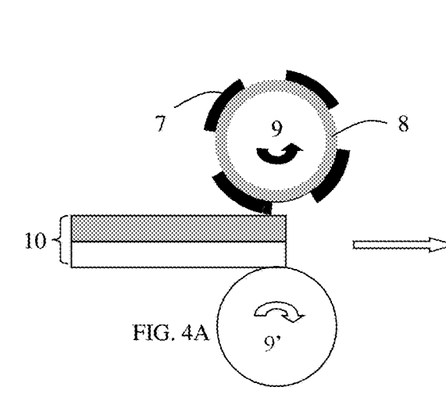
Figure 4B:
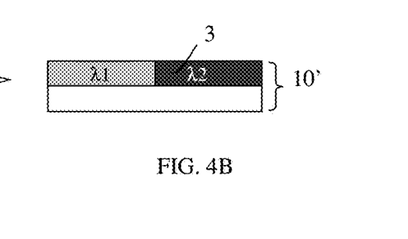

In a third embodiment, shown in FIG. 4A, the heat-transfer mask, 7 and 8, is wound around a heated roller 9. Together with a counter roller 9', the pair functions as a heated laminator which presses the heat-transfer mask against a partially polymerized CLCP web 10 to transfer the image. The speed of the web process is determined by the minimum time required for the mask to be in contact with the CLCP layer for transferring the image. FIG. 4A illustrates schematically a single laminator system which can be part of a continuous roll-to-roll production line. FIG. 4B shows the resultant two-color CLCP label 10'. The line's speed can be increased by using multiple synchronized heated rollers with identical masks, where the image transfer is accomplished over few repeated heat-transfer operations.

Figure 5A:
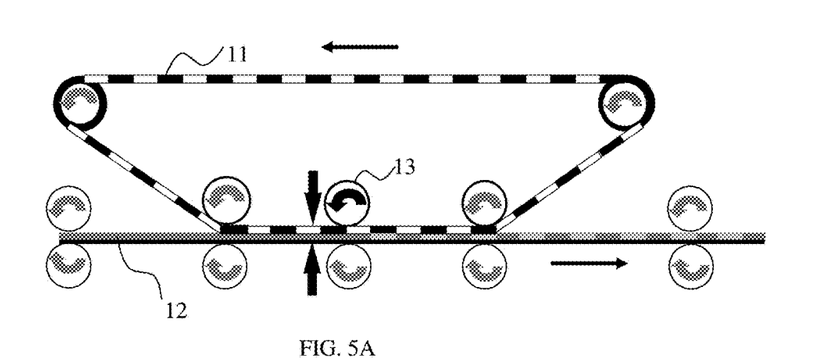

In a fourth embodiment, the heat-transfer mask method disclosed in the second embodiment can be adapted to a continuous roll-to-roll process by using a mask 11 in closed loop belt format, as shown in FIG. 5A. The belt is laminated temporarily to the CLCP web 12 and one or more high temperature rollers 13 transfer the image to the CLCP. After the image transfer step, the belt is delaminated from the CLCP web. A mask in a belt form is most suitable for generating fixed multicolor images.

Figure 5B:
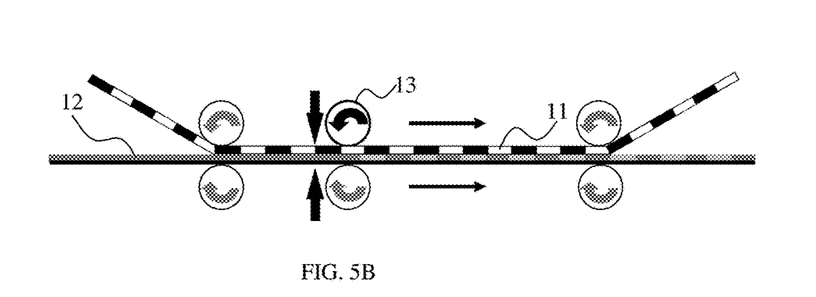

Alternatively, as indicated by FIG. 5B, the heat-transfer mask 11 can be printed on a separate roll of substrate and be laminated at elevated temperature to the partially polymerized CLCP web 12. Mask 11 can be delaminated and rolled up after this step. This implementation permits the fabrication of custom or serialized images.

One significant advantage of the forth embodiment is that the production line can be designed such that the mask will move at the same speed as the CLCP substrate. In this design, the mask remains stationary with respect to the CLCP web between the lamination and delamination points. This feature allows for the use of additional heated laminators as needed to complete the image transfer to the CLCP layer, a feature which is particularly useful in high speed lines.

Figure 5C:
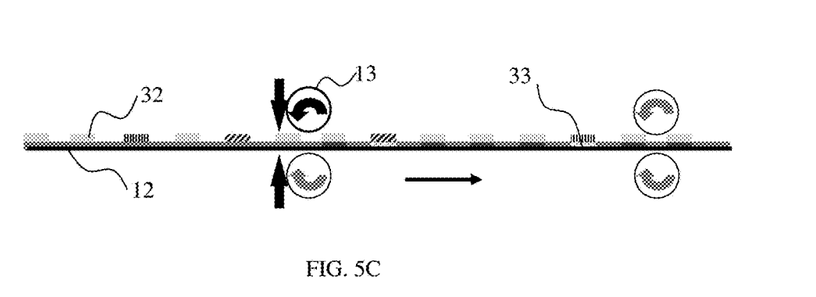
FIG. 5C illustrates the process where the heat-transfer mask is printed directly onto the partially polymerized CLCP.
Figure 6A:
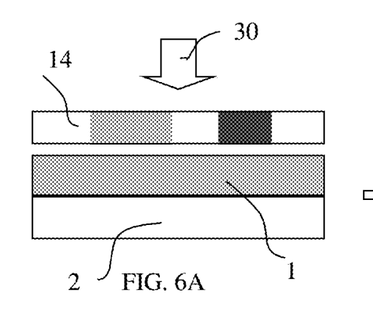
FIG. 6A illustrates the cross-section of a CLC layer that is exposed to a UV light source through a photomask, thus forming locally partially polymerized CLCP regions of different levels of polymerization.
Figure 6B:
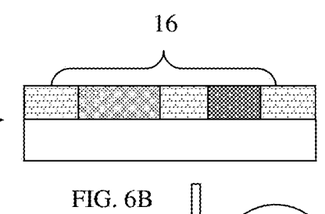
FIG. 6B illustrates the cross-section of a latent image in said CLCP as a result of the prior step.
Figure 6C:
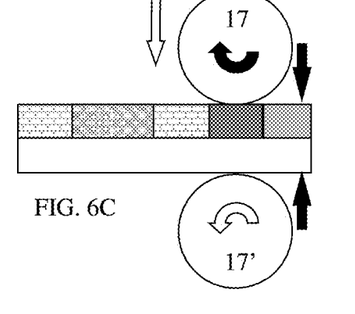
FIG. 6C illustrates a cross-sectional view of said CLCP passing through a heated laminator, producing a multi-colored pattern, as shown in FIG. 6D, in said CLCP.
Figure 6D:
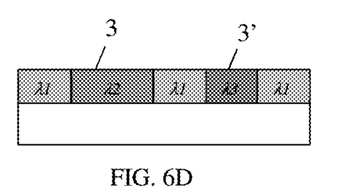
Figure 6E:
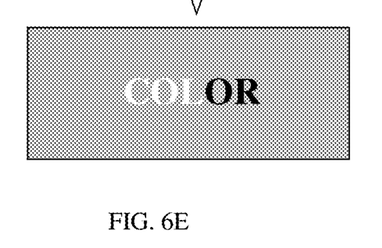
FIG. 6E is a top view of said multicolor CLCP.

In a fifth embodiment, the heat-conductive materials are transparent. This feature provides the option for a substrate-less implementation of the heat-transfer mask technique. In this embodiment, the mask, i.e., the heat conductive material only, is printed directly on the partially polymerized CLCP layer by any one of the previously mentioned mask printing methods. The printing of the mask thus becomes an integral step of the fabrication process of multicolor images in a CLCP layer. The pattern of heat-conductive materials, comprise a single or multiple distinct materials, on top of the CLCP is converted into a multicolor image by subjecting the partially polymerized and masked CLCP web to elevated temperature and pressure by a single or multiple heated laminators. FIG. 5C shows schematically an implementation of the conversion step on a continuous roll-to-roll line. A pattern of transparent, good heat-conducting materials, 32, which is printed on a partially polymerized CLCP web, 12, is subjected to elevated temperature and pressure by a heated laminator, 13, to generate a multicolor pattern, 33, in the CLCP. The transparent mask can be subsequently optically index matched by a transparent top-coating, rendering the mask invisible.

In yet another class of embodiments, a UV blocking mask is used to create a latent image in the CLCP, where different regions are partially cured to different degrees.

The general term "UV mask" will mean herein: an optical photomask capable of blocking UV radiation. UV blocking can be accomplished by reflection or absorption. "Binary masks" have transmission that is approximately 0 or 1. Another class of masks is that of "truly grayscale" masks whose transmission can be adjusted to any arbitrary values between 0 and 1. The transmission of a grayscale mask can vary across the mask area in a continuous or discrete fashion. Binary or true grayscale masks are typically made of metallic coatings of variable thickness. They can be employed in projection mode or as proximity masks and are most suitable for the production of CLCP labels with fixed images.

Another useful type of UV mask is a "printed UV mask". The mask is printed using, for example, a series of UV absorbing inks, each having a different degree of UV absorption. Images of the printed UV masks can be binary or truly grayscale or halftone images. Upon UV exposure of the CLCP through such a mask, different parts of the image will be polymerized to different degrees. Processing the heterogeneously partially-cured CLCP at elevated temperature and pressure shifts the color of different image parts to different final reflection colors.

Grayscale UV masks can also be produced using a large variety of halftone printing techniques. Standard "halftone" printing refers to a reprographic technique that simulates grayscale levels through the use of distributed discrete, very small printed dots. Since human vision integrates the effect of sub-resolution features, a variation in the dots' size or spacing is perceived as a variation in grayscale levels. Halftone techniques are used, for example, by most industrial and office printers to generate monochromatic grayscale images. Halftone techniques are also used to produce a wide gamut of colors by colored printers. This is done by mixing dots of different colors and controlling the proportions of their relative areas. In standard printing, the perceived color includes a contribution from the spaces between the dots (e.g., white background when printing on white paper).

Similarly, generating halftone features in a CLCP layer with different reflective RGB reflecting dots, can produce a wide gamut of colors, particularly on a black background. It is also desirable to be able to control the brightness of the colored images but CLCP materials have no intrinsic property with which to control it. However, effective brightness control can be achieved by using half-tone features in a CLCP layer on a substrate with black background.

UV masks can employ UV absorbing inks or toners and take advantage of widely available inexpensive printing equipment. A variety of techniques can be used to print UV masks: inkjet, laser printing, screen printing, flexography or gravure printing. Printed UV masks can use a wide range of substrate materials that are compatible with the printing technique and with roll-to-toll production process. Paper, coated paper, PET (polyester) or polyester based films are often used as substrate materials. Digital printing techniques are suitable for generating variable images. Printed UV mask can be used in a projection mode (collimated UV), but in a roll-to-roll production lines they are more suitable as proximity masks on either side of the CLCP layer.

The UV absorbing materials can be organic dyes, soluble in water or solvents, or solid UV pigments or toners. While many dyes' and pigments' absorb in the UV and through the visible range, there are materials that absorb only in the UV and are essentially transparent in the visible range.

A sixth embodiment, illustrated in FIG. 6, demonstrates yet another method of creating a multicolor image in a CLCP layer. First, a grayscale patterned UV photomask 14 (shown in FIG. 6A) is placed in proximity to the top of a partially polymerized CLCP 1 and said CLCP is subjected to a UV exposure from a UV source 30 through a mask 14. The latent CLCP image 16 comprises distinct regions that are partially polymerized to different degrees—a grayscale of polymerization (FIG. 6B). When said patterned and partially polymerized CLCP layer is subjected to a uniform elevated temperature and pressure (FIG. 6C) provided by heated lamination rollers 17 and 17', said different regions 3, 3' (FIG. 6D) undergo different degrees of color shifts, thus generating a multicolor image (FIG. 6E) of colors $\lambda_2$ and $\lambda_3$ against the background reflection color $\lambda_1$ of 1. The UV photomask can be positioned in proximity to the CLC or to its substrate side or be laminated to the substrate.

Figure 7A:
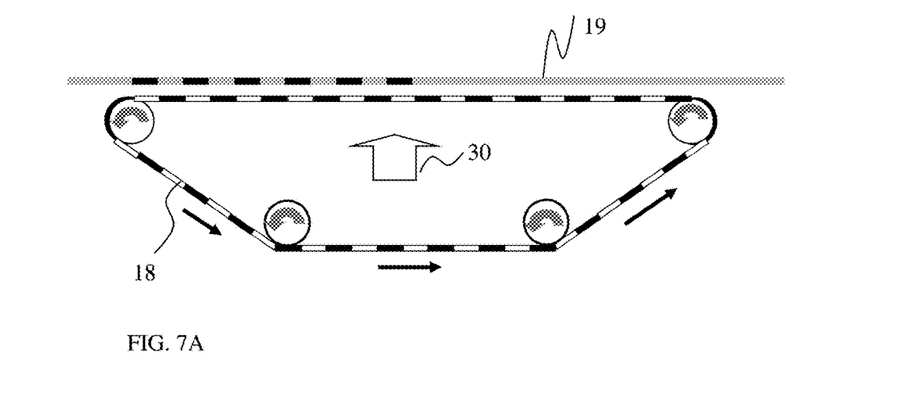
Figure 7B:
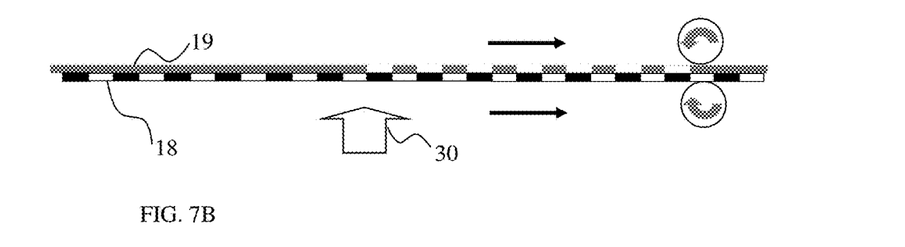

In a seventh embodiment, the printed UV masks are used in a sheet format for batch processes or in a roll of film format or in a belt format for continuous line processes, as shown in FIG. 7. A UV mask 18 in a belt format is temporarily laminated to the CLCP substrate or brought into close proximity to either side of the CLCP web 19 on a continuous production line (FIG. 7A). Both web and mask travel at the same speed during the latent-image forming step when the CLCP web 19 is exposed to a UV radiation 30. Subsequently, the mask film 18 is delaminated or otherwise removed from the CLCP web. Alternatively, (FIG. 7B), a UV photomask 18 is printed on a separate roll of film and is brought into close proximity to the CLC web 19 or is actually laminated to the CLCP substrate in a prior, separate operation. Both, the mask and the CLCP web, are moving at the same speed. After the UV exposure step, the mask can be removed or delaminated and wound on a separate roller.

If the entire CLC is partially cured in a prior step, the UV mask can be printed directly, as part of the process, on the CLCP layer or on its substrate. If needed, the mask's material can be washed off at a later step. Alternatively, if the UV mask material is transparent in the visible range, it can be printed directly on the CLCP or its substrate and, at the completion of the process, be index matched by a transparent coating material which will render the mask invisible. After UV exposure through the mask, in either of the above implementations, the CLCP web is passed through a heated laminator to convert the latent image into a visible multicolor image.

Figure 8:
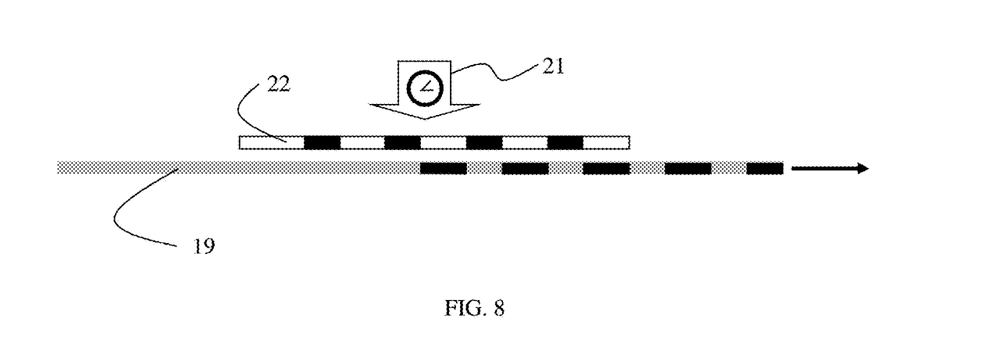
FIG. 8 illustrates a cross-sectional view of a continuous roll-to-roll process using a stationary UV photomask with a moving CLCP web.

An eighth embodiment, shown in FIG. 8, teaches the production of multicolor images using a stationary UV photomask 22. In this embodiment, a partially-cured latent image is created in a CLC or in a uniformly partially polymerized CLCP layer 19 through a proximity UV mask. A high intensity UV source 21 that is either shuttered (e.g. mercury lamp) or is switchable (e.g. UV LED) is required if the UV mask 22 is stationary while the CLCP web is moving. A partially-curing UV dose is delivered by a very short and intense UV pulse during which the CLCP web moves only a small fraction of the image size.

The partial polymerization steps disclosed in the sixth, seventh and eighth embodiments can be implemented in two distinct ways. In a first implementation, the entire CLC layer is first partially-cured without a mask to form a partially polymerized CLCP. The CLCP is then further partially cured through a UV mask to create a latent image with different degrees of partial polymerization. A multicolor image is generated by subjecting said CLCP to elevated temperature and pressure. In a second implementation, the partial-curing is accomplished only once by a single UV exposure through a mask which creates a latent image with different degrees of partial polymerization. In both implementation, after developing a multicolor image, an additional and final UV exposure is required to fully cure the CLCP layer and essentially freeze-in the multicolor image.

In a ninth embodiment, a mask-less UV curing process is accomplished by partially polymerizing a CLC layer with a scanning UV laser. The laser beam provides the correct partial polymerizing dose to each point in selected areas in the CLC layer, or further cures an already partially and uniformly cured CLCP. As a result, a high resolution latent grayscale image of polymerization is generated by the laser in the CLCP, which can be converted into a multicolor image by applying elevated temperature and pressure. In one implementation, the UV laser is raster scanned and thus potentially addresses each point on the CLC. In this implementation, the image can be exposed to a higher or lower UV dose than the background. In another implementation, the entire CLC is uniformly partially polymerized and only the image parts are addressed by the UV laser, possibly in a vector addressing mode. In the latter implementation, the image parts are exposed to higher UV doses than the background. The uniform curing can be executed before or after the laser scanning.

Figure 9A:
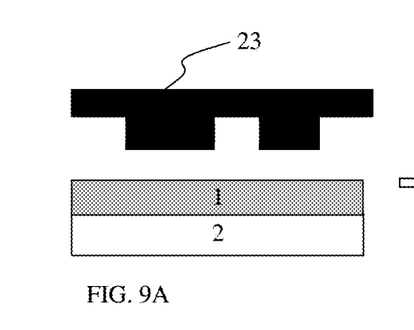
FIG. 9A illustrates a cross-sectional view of a heated die mask placed above said CLCP.
Figure 9B:
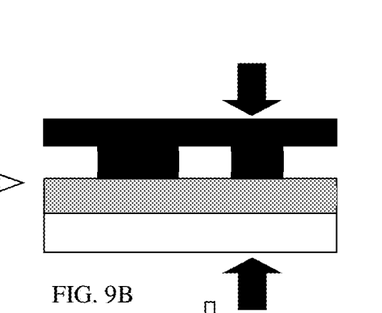
FIG. 9B shows a cross-sectional view of said CLCP and said die mask being mechanically compressed together.
Figure 9C:
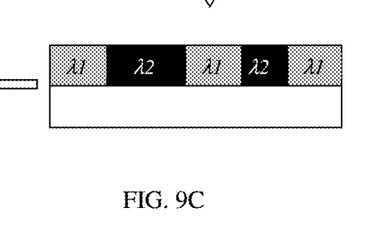
FIGS. 9C and 9D illustrate the cross-sectional and top-views, respectively, of the resulting two-color image in said CLCP film.
Figure 9D:
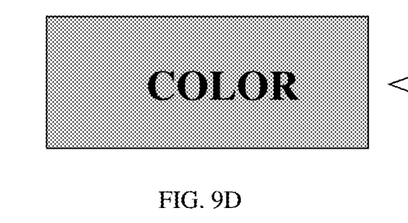

A tenth embodiment is akin to a hot stamping technique using a flat mask. In this embodiment, an engraved metal sheet or an inscribed polymer plate (e.g., silicon rubber plate) carries the image (or the complementary image) in the form of protruding features. The heat conductivity of the image carrying material is uniform throughout the mask. The uniformly heated mask is brought into contact under pressure with a partially polymerized CLCP layer to transfer the protruding image into a multicolor image. This embodiment is illustrated schematically in FIG. 9. FIG. 9A shows a heated mask 23 facing a partially polymerized CLCP film 1. FIG. 9B illustrates the pressing of the two media together, usually by a laminator, to transfer the image into said CLCP using elevated temperature and pressure. FIG. 9C shows the induced image in the CLCP layer where regions reflecting $\lambda_2$ correspond to areas on the mask that made contact with the CLCP and regions reflecting $\lambda_1$ (a longer wavelength) correspond to regions that did not make contact. FIG. 9D is a depiction of the front view of a two-color CLCP label fabricated according to the current embodiment. This fabrication method is suitable for batch processes that can use commercially available hot stamp presses. In another direct digital implementation of the current embodiment, a thermal printer head is pressed onto the CLCP to transfer a thermal image into a multicolor image.

Figure 10:
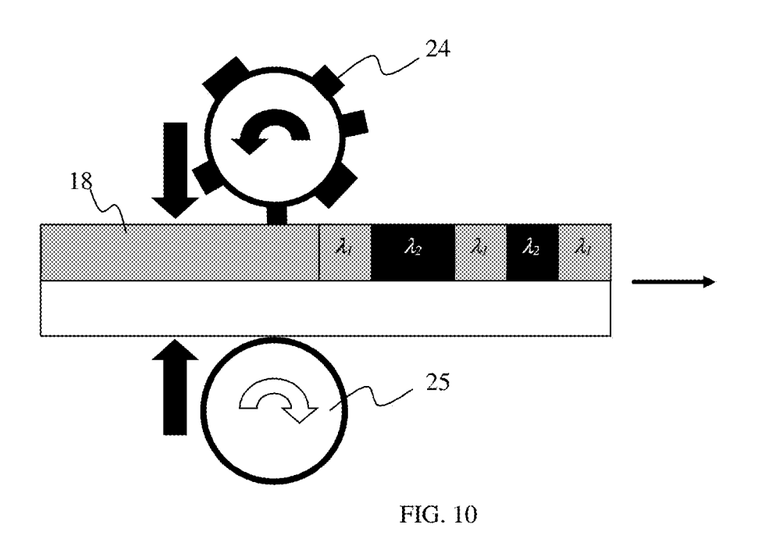
FIG. 10 illustrates schematically a cross-sectional view of a roll-to-roll hot-stamping process for fabricating a multicolor image in a CLCP layer using a heated engraved roller.
Figure 11:
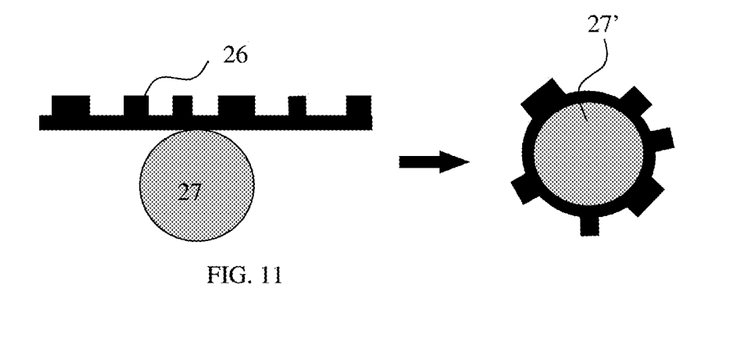
FIG. 11 depicts schematically a cross-sectional view of a roller in a hot-stamping roll-to-roll process for fabricating a multicolor image in a CLCP layer, where an engraved thin mask sheet is wound around the roller.

In an eleventh embodiment, the hot-stamping batch process of the tenth embodiment is adapted to a continuous roll-to-roll production process as illustrates schematically in FIG. 10. A uniformly heated engraved cylinder 24, whose surface carries the image (or the complementary image) in the form of protruding features, is brought into contact with a partially polymerized CLCP layer. FIG. 10 shows the CLCP web drawn between two co-pressed cylinders: a uniformly heated engraved cylinder 24, which is in contact with the CLCP web 18, and a smooth cylinder 25 that is counter pressing the CLCP web from below. Only the protruding features of the engraved cylinder 24 make contact with the web and transfer the image into the CLCP layer. Other configurations can be used as well: the engraved cylinder may be in contact with the substrate rather than with the CLCP layer; or the smooth cylinder may be heated rather than the engraved cylinder. In another implementation, FIG. 11, an engraved sheet of mask 26 is wound around a smooth cylinder 27. The image carrying cylinder 27' replaces the engraved cylinder 24 in FIG. 10 in a continuous process where the CLCP web 18 is selectively heated and compressed between 27' and its counter roller 25.

Figure 12:
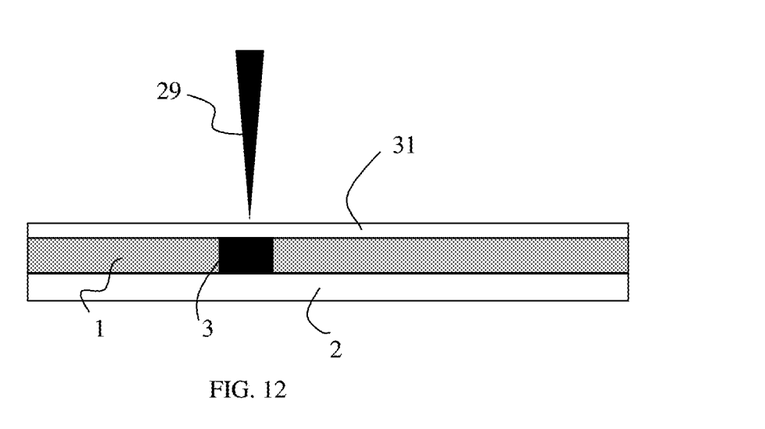
FIG. 12 illustrates schematically a cross-sectional view of a process of fabricating a multicolor image in a partially polymerized CLCP layer using a stylus-like tool.

Referring to FIG. 12, a twelfth embodiment teaches the application of local pressure to a partially polymerized CLCP layer 1, with or without simultaneous heating, by a pen-like instrument 29 or any kind of stylus for hand-writing (including finger printing) or machine-writing (e.g. a plotter) of information on said CLCP medium. The CLCP is optionally covered with a protective film 31, such as a silicone coated PET, with the silicone side facing to CLCP. In one scenario, the CLCP is placed on a hot plate and one uses a stylus to write into the CLCP through the thin protective film. The pressure of the handwriting, with the assistance of heat, modifies the local value of the pitch; therefore, the writing mark 3 stands out from the background with a distinct color. In another scenario, a heated stylus is used for writing on a CLCP at room temperature with a similar result. Yet in another scenario, only pressure is required to produce a visible mark of a distinct color in the CLCP layer at ambient temperature. In yet another scenario, no protection layer is used and writing takes place directly on the CLCP layer. Yet another implementation is a machine, such as a plotter, that controls a stylus and performs the writing. In one image design, the CLCP's original reflection peak is in the near-infrared, for instance at 850 nm, rendering it transparent. After pressure is applied (according to any of the above scenarios), the written feature becomes red-reflecting, and in some cases even green or blue-reflecting. This embodiment is useful for security markings, signatures and finger prints.

In all of the above embodiments, at completion of each of the outlined processes, a complete and final curing step takes place to prevent alteration of the device' optical features or the embedded information during its commercial use. Full curing also protects the device from degrading environments. In addition, a top protection layer may be optionally coated over the CLCP-air surface for similar reasons. If the protection layer is UV curable, it can be coated before the final and complete cure of the CLCP, such that both layers can be fully cured in one operation.

All of the above-mentioned embodiments can be employed to produce useful optical security devices that can be employed for document optical security or brand protection applications or in any other application where the presence of an optical security device authenticates the article with which it is associated. The authentication integrity of such optical security devices derives from the impossibility of replicating all their optical properties with standard reproduction techniques and from the complexity and high cost that is required to setup and operate a production line for identical optical security devices.

Optical security devices produced according to any of the above embodiments have multicolor images. Since all of the above fabrication methods preserve the original chirality of the CLC, all colors in the final optical device reflect the same circular polarization. When viewed through a circular polarizer that matches the chirality of the CLCP, the images and background will be seen clearly while when viewed through an opposite circular polarizer, they will be completely extinguished or appear very dark. This feature can be utilized by a second level handheld validation device using one or two opposite circular polarizers to confirm the presence of a CLCP material and thereby authenticate the security device.

What is claimed is:

1. A method of fabricating an optical device containing multicolor images in a single layer of cholesteric liquid crystal polymer (CLCP), where said method comprises the following steps:
    A) coating a layer of CLC monomer mixture on a substrate and annealing said layer to form a planar CLC;
    B) exposing said CLC layer with a controlled dose of actinic radiation to form a partially polymerize CLCP layer;
    C) addressing selected areas in said CLCP that are designated for color change;

D) forming multicolor images in said selected areas by applying pressure at elevated temperature to said partially polymerized CLCP layer;
E) completely polymerizing said partially polymerized and multicolored CLCP layer; and
F) applying a top coating onto said completely polymerized and multicolored CLCP layer at the CLCP-air interface.

2. A method of fabricating an optical device containing multicolor images as in claim 1, where steps C and D are combined and performed by a thermal transfer printer or by a laser printer applied directly on said partially polymerized CLCP.

3. A method of fabricating an optical device containing multicolor images as in claim 1, where steps B and C are accomplished together by UV exposure through a patterned UV photomask.

4. A method of fabricating an optical device containing multicolor images as in claim 3, where the transmission of said UV photomask is binary, or has a continuous grayscale, or has a half-tone grayscale.

5. A method of fabricating an optical device containing multicolor images as in claim 3, where said UV photomask is in a form of a roll of film or a closed-loop belt, and where said mask is either laminated to the CLCP web or is in a close proximity to it, and where the UV mask and the CLCP web move at the same speed during the UV exposure through said photomask.

6. A method of fabricating an optical device containing multicolor images as in claim 3, where said UV mask materials comprise UV absorbing dyes or toners that are printed on a UV transparent substrate.

7. A method of fabricating an optical device containing multicolor images as in claim 3, where said UV mask materials are printed directly on the partially polymerized CLCP layer or on its substrate and where the printed materials comprise UV absorbing dyes, toners, or polymers that are transparent in the visible spectrum.

8. A method of fabricating an optical device containing multicolor images as in claim 1, where step C is accomplished by exposing said CLC layer to a UV laser which scans said CLC and partially polymerizes selected regions, said laser operation is optionally preceded or followed by a UV exposure of the entire said CLC layer.

9. A method of fabricating an optical device containing multicolor images as in claim 1, where steps C and D are accomplished together by bringing a heat-transfer mask into contact with said partially polymerized CLCP layer, while applying high pressure and elevated temperature.

10. A method of fabricating an optical device containing multicolor images as in claim 9, where said heat-transfer mask comprises highly heat-conductive inks, toners, or polymers and a substrate.

11. A method of fabricating an optical device containing multicolor images as in claim 9, where said heat-transfer mask comprises transparent highly heat-conductive inks, toners, or polymers that are printed directly on the said partially polymerized CLCP.

12. A method of fabricating an optical device containing multicolor images as in claim 9, where said heat-transfer mask is printed on a roll of film or on a closed-loop belt, and said mask is in contact with said partially polymerized CLCP layer and both move at the same speed.

13. A method of fabricating an optical device containing multicolor images as in claim 1, where steps C and D is accomplished together by bringing an engraved mask into contact with said partially polymerized CLCP layer under a high pressure and elevated temperature.

14. A method of fabricating an optical device containing multicolor images as in claim 13, where said engraved mask comprises a cylinder having protruding features or an engraved sheet wound around a cylinder.

15. A method of fabricating an optical device containing multicolor images as in claim 1, where steps C and D are accomplished together by pressing and moving a stylus or stylus-like tool, with optional assistance of heat, manually or by machine, against said partially polymerized CLCP.

\* \* \* \* \*